United States Patent
Fornage et al.

(10) Patent No.: US 11,936,232 B2
(45) Date of Patent: Mar. 19, 2024

(54) METHOD AND SYSTEM FOR AN AC BATTERY

(71) Applicant: Enphase Energy, Inc., Petaluma, CA (US)

(72) Inventors: Martin Fornage, Petaluma, CA (US); Mauricio Cespedes Moya, San Francisco, CA (US)

(73) Assignee: Enphase Energy, Inc., Petaluma, CA (US)

( * ) Notice: Subject to any disclaimer, the term of this patent is extended or adjusted under 35 U.S.C. 154(b) by 210 days.

(21) Appl. No.: 17/542,635

(22) Filed: Dec. 6, 2021

(65) Prior Publication Data

US 2022/0140623 A1 May 5, 2022

Related U.S. Application Data

(63) Continuation of application No. 17/539,681, filed on Dec. 1, 2021, which is a continuation of application
(Continued)

(51) Int. Cl.
| | |
|---|---|
| *H02J 7/00* | (2006.01) |
| *G01R 31/3842* | (2019.01) |
| *H02J 7/02* | (2016.01) |
| *G01R 31/392* | (2019.01) |
| *H02M 7/66* | (2006.01) |

(52) U.S. Cl.
CPC .... *H02J 7/007184* (2020.01); *G01R 31/3842* (2019.01); *H02J 7/00032* (2020.01); *H02J 7/0014* (2013.01); *H02J 7/0029* (2013.01); *H02J 7/0048* (2020.01); *H02J 7/00712* (2020.01); *H02J 7/02* (2013.01); *G01R 31/392* (2019.01); *H02J 7/00304* (2020.01); *H02J 7/00309* (2020.01); *H02J 2207/20* (2020.01); *H02M 7/66* (2013.01)

(58) Field of Classification Search
USPC .......................................................... 320/132
See application file for complete search history.

(56) References Cited

U.S. PATENT DOCUMENTS

| | | | | |
|---|---|---|---|---|
| 6,300,763 B1 * | 10/2001 | Kwok | ................... | H01M 10/44 320/132 |
| 7,570,024 B2 * | 8/2009 | Melichar | ............ | G01R 31/3828 320/132 |

(Continued)

FOREIGN PATENT DOCUMENTS

JP 2004134658 4/2004

OTHER PUBLICATIONS

CN103085677 Machine Translation (Year: 2012).*

*Primary Examiner* — Samuel Berhanu
(74) *Attorney, Agent, or Firm* — Moser Taboada

(57) ABSTRACT

A method and system for AC battery operation. In one embodiment, the method comprises determining, at a battery management unit (BMU) coupled to an AC battery comprising a power converter and a battery that is rechargeable, a bias control voltage that indicates a state of a charge process of the AC battery; and coupling, by a bias control module of the BMU, the bias control voltage to the power converting for communicating the state of the charge process to and from the BMU and the power converter.

20 Claims, 3 Drawing Sheets

Related U.S. Application Data

No. 15/952,735, filed on Apr. 13, 2018, now Pat. No. 11,218,006.

(60) Provisional application No. 62/485,219, filed on Apr. 13, 2017.

(56) References Cited

U.S. PATENT DOCUMENTS

| | | | |
|---|---|---|---|
| 8,234,509 B2* | 7/2012 | Gioscia | H02J 50/90 320/108 |
| 2003/0025479 A1 | 2/2003 | Kikuchi | |
| 2004/0162683 A1* | 8/2004 | Verbrugge | G01R 31/367 702/64 |
| 2006/0074574 A1 | 4/2006 | Gasda | |
| 2008/0218127 A1 | 9/2008 | Kao et al. | |
| 2008/0266913 A1 | 10/2008 | Brotto et al. | |
| 2009/0051324 A1 | 2/2009 | Nakatsuji | |
| 2011/0000725 A1 | 1/2011 | Murota | |
| 2011/0115295 A1 | 5/2011 | Moon et al. | |
| 2011/0156655 A1 | 6/2011 | Kim | |
| 2012/0032641 A1 | 2/2012 | Yun | |
| 2013/0026979 A1 | 1/2013 | Endo et al. | |
| 2013/0082663 A1 | 4/2013 | Mori et al. | |
| 2013/0090797 A1* | 4/2013 | Izumi | H02J 7/04 701/22 |
| 2013/0106363 A1* | 5/2013 | Seman, Jr. | H02J 7/0069 320/137 |
| 2013/0241500 A1* | 9/2013 | Cheng | H02J 7/007194 320/154 |
| 2013/0285610 A1 | 10/2013 | Katou et al. | |
| 2015/0032394 A1 | 1/2015 | Kimura | |
| 2015/0070024 A1* | 3/2015 | Kim | G01R 31/392 324/430 |
| 2015/0236529 A1 | 8/2015 | Tanaka et al. | |
| 2015/0339181 A1* | 11/2015 | Dolfi | H04L 43/00 714/5.1 |
| 2016/0187429 A1 | 6/2016 | Kawai | |
| 2017/0125856 A1* | 5/2017 | Okada | H01M 10/425 |
| 2017/0338668 A1* | 11/2017 | Sada | H02J 3/32 |

* cited by examiner ies of each of
METHOD AND SYSTEM FOR AN AC BATTERY

CROSS-REFERENCE TO RELATED APPLICATIONS

This application is a continuation application of U.S. patent application Ser. No. 17/539,681, filed Dec. 1, 2021, which is a continuation application of U.S. patent application Ser. No. 15/952,735, filed Apr. 13, 2018, which claims priority to and the benefit of U.S. Provisional Patent Application No. 62/485,219, entitled "Low Cost Battery Inverter" and filed on Apr. 13, 2017, the entire contents of each of these applications is incorporated herein by reference.

BACKGROUND OF THE INVENTION

Field of the Invention

Embodiments of the present disclosure relate generally to power conversion and, more particularly, to a battery management unit (BMU) to power conditioner interface for use in distributed energy generators.

Description of the Related Art

Battery systems are used in a large variety of applications for providing a source of power as well as energy storage. In addition to DC battery systems which provide DC power, there are also AC battery systems which provide AC power. Such AC battery systems may be used for storing and providing energy in distributed energy generators, for example in microgrids.

Conventional AC battery systems provide AC power via one or more DC-AC inverters coupled to the DC output from one or more rechargeable batteries. Battery devices such as lithium-based products can require dedicated electronics—i.e., a battery management unit (BMU)—to accomplish proper performance and safety. However, BMUs typically connect through a controller area network (CAN), which may not be available on some distributed energy generator an inverter employed in distributed energy generators, such as photovoltaic (PV) inverters.

Therefore, there is a need in the art for a simplified battery management unit (BMU) to power conditioner interface which does not require a controller area network (CAN) bus or a special power conditioner to be used in the battery.

SUMMARY OF THE INVENTION

Embodiments of the present invention generally relate to a method and system for AC battery operation substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
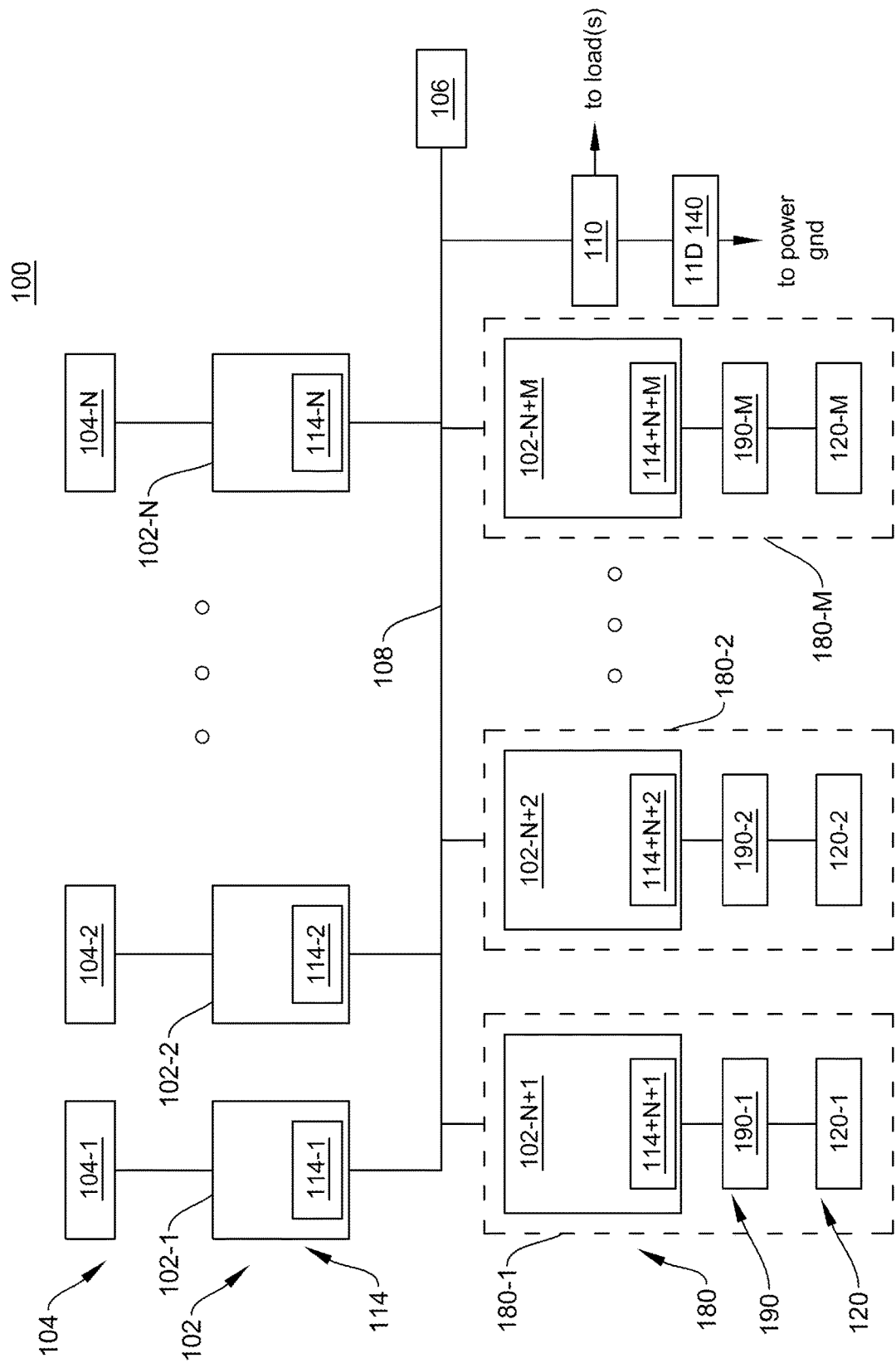
FIG. 1 is a block diagram of a system for power conversion using one or more embodiments of the present invention.

FIG. 1 is a block diagram of a system 100 for power conversion using one or more embodiments of the present invention. This diagram only portrays one variation of the myriad of possible system configurations and devices that may utilize the present invention.

The system 100 is a microgrid that can operate in both an islanded state and in a grid-connected state (i.e., when connected to another power grid (such as one or more other microgrids and/or a commercial power grid). The system 100 comprises a plurality of power converters (which also may be called power conditioners) 102-1, 102-2, . . . 102-N, 102-N+1, and 102-N+M collectively referred to as power converters 102; a plurality of power sources 104-1, 104-2, . . . 104-N, collectively referred to as power sources 104; a plurality of energy storage devices/delivery devices 120-1, 120-2, . . . 120-M collectively referred to as energy storage/delivery devices 120; a system controller 106; a plurality of battery management units (BMUs) 190-1, 190-2, . . . 190-M collectively referred to as BMUs 190; a system controller 106; a bus 108; a load center 110; and an island interconnect device (IID) 140 (which may also be referred to as a microgrid interconnect device (MID)). In some embodiments, such as the embodiments described herein, the energy storage/delivery devices 120 are rechargeable batteries which may be referred to as batteries 120, although in other embodiments the energy storage/delivery devices 120 may be any other suitable device for storing energy and providing the stored energy. Generally, each of the batteries 120 comprises a plurality cells that are coupled in series, e.g., eight cells coupled in series to form a battery 120.

Each power converter 102-1, 102-2 . . . 102-N is coupled to a DC power source 104-1, 104-2 . . . 104-N, respectively, in a one-to-one correspondence, although in some other embodiments multiple DC power sources 104 may be coupled to one or more of the power converters 102. The power converters 102-N+1, 102-N+2 . . . 102-N+M are respectively coupled to batteries 120-1, 120-2 . . . 120-M via BMUs 190-1, 190-2 . . . 190-M to form AC batteries 180-1, 180-2 . . . 180-M, respectively. Each of the power converters 102-1, 102-2 . . . 102-N+M comprises a corresponding controller 114-1, 114-2 . . . 114-N+M (collectively referred to as controllers 114) for controlling operation of the corresponding power converter 102-1, 102-2 . . . 102-N+M.

In some embodiments, such as the embodiment described below, the power sources 104 are DC power sources and the power converters 102 are bidirectional inverters such that the power converters 102-1 . . . 102-N convert DC power from the DC power sources 104 to grid-compliant AC power that is coupled to the bus 108, and the power converters 102-N+1 . . . 102-N+M convert (during energy storage device discharge) DC power from the batteries 120 to grid-compliant AC power that is coupled to the bus 108 and also convert (during energy storage device charging) AC power from the bus 108 to DC output that is stored in the batteries 120 for subsequent use. The DC power sources 104 may be any suitable DC source, such as an output from a previous power conversion stage, a battery, a renewable energy source (e.g., a solar panel or photovoltaic (PV) module, a wind turbine, a hydroelectric system, or similar renewable energy source), or the like, for providing DC power. In other embodiments the power converters 102 may be other types of converters (such as DC-DC converters), and the bus 108 is a DC power bus.

The power converters 102 are coupled to the system controller 106 via the bus 108 (which also may be referred to as an AC line or a grid). The system controller 106 generally comprises a CPU coupled to each of support circuits and a memory that comprises a system control module for controlling some operational aspects of the system 100 and/or monitoring the system 100 (e.g., issuing certain command and control instructions to one or more of the power converters 102, collecting data related to the performance of the power converters 102, and the like). The controller 106 is capable of communicating with the power converters 102 by wireless and/or wired communication (e.g., power line communication) for providing certain operative control and/or monitoring of the power converters 102.

In some embodiments, the system controller 106 may be a gateway that receives data (e.g., performance data) from the power converters 102 and communicates (e.g., via the Internet) the data and/or other information to a remote device or system, such as a master controller (not shown). Additionally or alternatively, the gateway may receive information from a remote device or system (not shown) and may communicate the information to the power converters 102 and/or use the information to generate control commands that are issued to the power converters 102.

The power converters 102 are coupled to the load center 110 via the bus 108, and the load center 110 is coupled to the power grid via the IID 140. When coupled to the power grid (e.g., a commercial grid or a larger microgrid) via the IID 140, the system 100 may be referred to as grid-connected; when disconnected from the power grid via the IID 140, the system 100 may be referred to as islanded. The IID 140 determines when to disconnect from/connect to the power grid (e.g., the IID 140 may detect a grid fluctuation, disturbance, outage or the like) and performs the disconnection/connection. Once disconnected from the power grid, the system 100 can continue to generate power as an intentional island, without imposing safety risks on any line workers that may be working on the grid, using the droop control techniques described herein. The IID 140 comprises a disconnect component (e.g., a disconnect relay) for physically disconnecting/connecting the system 100 from/to the power grid. In some embodiments, the IID 140 may additionally comprise an autoformer for coupling the balanced power system 100 to a split-phase load that may have a misbalance in it with some neutral current. In certain embodiments, the system controller 106 comprises the IID 140 or a portion of the IID 140.

The power converters 102 convert the DC power from the DC power sources 104 and discharging batteries 120 to grid-compliant AC power and couple the generated output power to the load center 110 via the bus 108. The power is then distributed to one or more loads (for example to one or more appliances) and/or to the power grid (when connected to the power grid); additionally or alternatively, the generated energy may be stored for later use, for example using batteries, heated water, hydro pumping, $H_2O$-to-hydrogen conversion, or the like. Generally the system 100 is coupled to the commercial power grid, although in some embodiments the system 100 is completely separate from the commercial grid and operates as an independent microgrid.

In some embodiments, the AC power generated by the power converters 102 is single-phase AC power. In other embodiments, the power converters 102 generate three-phase AC power.

Figure 2:
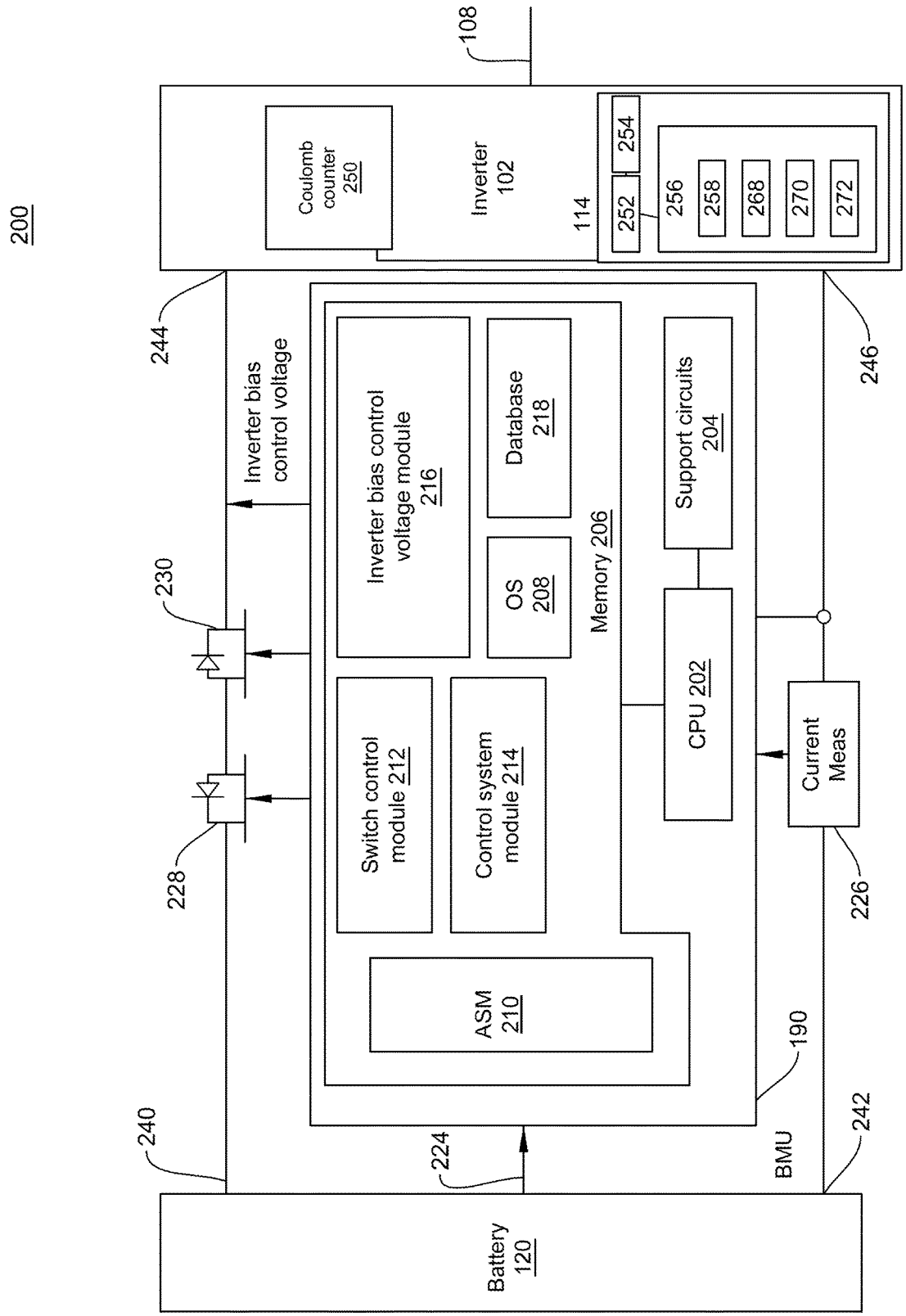
FIG. 2 is a block diagram of an AC battery system in accordance with one or more embodiments of the present invention.

FIG. 2 is a block diagram of an AC battery system 200 in accordance with one or more embodiments of the present invention. The AC battery system 200 comprises a BMU 190 coupled to a battery 120 and an inverter 102. A pair of metal-oxide-semiconductor field-effect transistors (MOSFETs) switches—switches 228 and 230—are coupled in series between a first terminal 240 of the battery 120 and a first terminal of the inverter 144 such the body diode cathode terminal of the switch 228 is coupled to the first terminal 240 of the battery 120 and the body diode cathode terminal of the switch 230 is coupled to the first terminal 244 of the inverter 102. The gate terminals of the switches 228 and 230 are coupled to the BMU 190.

A second terminal 242 of the battery 120 is coupled to a second terminal 246 of the inverter 102 via a current measurement module 226 which measures the current flowing between the battery 120 and the inverter 102.

The BMU 190 is coupled to the current measurement device 226 for receiving information on the measured current, and also receives an input 224 from the battery 120 indicating the battery cell voltage and temperature. The BMU 190 is coupled to the gate terminals of each of the switches 228 and 230 for driving the switch 228 to control battery discharge and driving the switch 230 to control battery charge as described herein. The BMU 190 is also coupled across the inverter terminals 244 and 246 for providing an inverter bias control voltage (which may also be referred to as a bias control voltage) to the inverter 102 as described further below.

The configuration of the body diodes of the switches 228 and 230 allows current to be blocked in one direction but not the other depending on state of each of the switches 228 and 230. When the switch 228 is active (i.e., on) while the switch 230 is inactive (i.e., off), battery discharge is enabled to allow current to flow from the battery 120 to the inverter 102 through the body diode of the switch 230. When the switch 228 is inactive while the switch 230 is active, battery charge is enabled to allow current flow from the inverter 102 to the battery 120 through the body diode of the switch 228. When both switches 228 and 230 are active, the system is in a normal mode where the battery 120 can be charged or discharged.

The BMU 190 comprises support circuits 204 and a memory 206, each coupled to a central processing unit (CPU) 202. The CPU 202 may comprise one or more processors, microprocessors, microcontrollers and combinations thereof configured to execute non-transient software instructions to perform various tasks in accordance with embodiments of the present invention. The CPU 202 may additionally or alternatively include one or more application specific integrated circuits (ASICs). In some embodiments, the CPU 202 may be a microcontroller comprising internal memory for storing controller firmware that, when executed, provides the controller functionality described herein. The BMU 190 may be implemented using a general purpose computer that, when executing particular software, becomes a specific purpose computer for performing various embodiments of the present invention.

The support circuits 204 are well known circuits used to promote functionality of the CPU 202. Such circuits include, but are not limited to, a cache, power supplies, clock circuits, buses, input/output (I/O) circuits, and the like. The BMU 190 may be implemented using a general purpose computer that, when executing particular software, becomes a specific purpose computer for performing various embodiments of the present invention. In one or more embodiments, the CPU 202 may be a microcontroller comprising internal memory for storing controller firmware that, when executed, provides the controller functionality described herein.

The memory 206 may comprise random access memory, read only memory, removable disk memory, flash memory, and various combinations of these types of memory. The memory 206 is sometimes referred to as main memory and may, in part, be used as cache memory or buffer memory. The memory 206 generally stores the operating system (OS) 208, if necessary, of the controller 114 that can be supported by the CPU capabilities. In some embodiments, the OS 208 may be one of a number of commercially available operating systems such as, but not limited to, LINUX, Real-Time Operating System (RTOS), and the like.

The memory 206 stores non-transient processor-executable instructions and/or data that may be executed by and/or used by the CPU 202. These processor-executable instructions may comprise firmware, software, and the like, or some combination thereof. The memory 206 stores various forms of application software, such as an acquisition system module 210, a switch control module 212, a control system module 214, and an inverter bias control voltage module 216 (which may also be referred to as bias control module 216). The memory 206 additionally stores a database 218 for storing data related to the operation of the BMU 190 and/or the present invention, such as one or more thresholds, equations, formulas, curves, and/or algorithms for the control techniques described herein. In various embodiments, one or more of the acquisition system module 210, the switch control module 212, the control system module 214, the inverter bias control voltage module 216, and the database 218, or portions thereof, are implemented in software, firmware, hardware, or a combination thereof.

The acquisition system module 210 obtains the cell voltage and temperature information from the battery 120 via the input 224, obtains the current measurements provided by the current measurement module 226, and provides the cell voltage, cell temperature, and measured current information to the control system module 214 for use as described herein.

The switch control module 212 drives the switches 228 and 230 as determined by the control system module 214.

The control system module 214 provides various battery management functions, including protection functions (e.g., overcurrent (OC) protection, overtemperature (OT) protection, and hardware fault protection), metrology functions (e.g., averaging measured battery cell voltage and battery current over, for example, 100 ms to reject 50 and 60 Hz ripple), state of charge (SOC) analysis (e.g., coulomb gauge for determining current flow and utilizing the current flow in estimating the battery SOC; synchronizing estimated SOC values to battery voltages (such as setting SOC to an upper bound, such as 100%, at maximum battery voltage; setting SOC to a lower bound, such as 0%, at a minimum battery voltage); turning off SOC if the inverter 102 never drives the battery 120 to these limits; and the like), balancing (e.g., autonomously balancing the charge across all cells of a battery to be equal, which may be done at the end of charge, at the end of discharge, or in some embodiments both at the end of charge and the end of discharge). By establishing upper and lower estimated SOC bounds based on battery end of charge and end of discharge, respectively, and tracking the current flow and cell voltage (i.e., battery voltage) between these events, the BMU 190 determines the estimated SOC.

In order to prevent inverter idle current from completely discharging the battery 120 (and thereby destroying the battery 120) if the battery 120 remains unpowered for a long period of time, the BMU 190 detects when the battery SOC falls below a certain threshold (e.g., 20%). When the battery SOC falls below the threshold, the BMU 190 disconnects the inverter 102 from the battery 120 and operates in a micropower mode (e.g., <0.1 mA). The BMU 190 periodically attempts to reconnect by powering the inverter 102 until current flows in. In some embodiments, a semi-random increasing timer can be used for determining when the BMU 190 attempts to reconnect, for example every 2 minutes, then 5 minutes then 20 minutes, then hourly, then 18 hours, etc. The timer for determining when the BMU 190 attempts the reconnect is reset each time the battery 120 is disconnected.

The inverter bias control module 216 converts the battery voltage to a stabilized voltage which provides an indication of the state of the system and powers up the inverter 102; the inverter bias control module 216 thus communicates the state of the charge process to and from the BMU 190 and the inverter 102. When the BMU 190 does not allow charging or discharging, the inverter bias control module 216 regulates the battery output voltage to a predefined value, for example 12V. When no current is flowing between the battery 120 and inverter 102, the inverter 102 is driven by the inverter bias control voltage which provides information to the inverter 102 indicating the system state. In certain embodiments, a buck-boost converter is used having a power level below 1 W. Exemplary values of the inverter bias control voltage and their corresponding state information are shown in Table 1 below. The bias voltages shown in Table 1 are selected so that the first six shown are below the normal operating voltage of the battery 120 and the last three shown are above the normal operating voltage of the battery 120. In some embodiments, such as the embodiment corresponding to the bias voltages shown in Table 1, the battery operating voltage is 20 to 32V. For embodiments where the battery 120 has a lower or higher operating voltage range than this, the decision points from Table 1 should be scaled appropriately.

TABLE 1

| Bias Voltage | Meaning |
| --- | --- |
| <=12 | Ready to charge |
| 13 | Balancing at bottom SOC |
| 14 | End of discharge |
| 15 | Over current |
| 16 | Over temperature |
| 17 | Non-recoverable hardware fault: blown fuse, etc. |
| 36 | End of charge |
| 37 | Balancing at top SOC |
| 38 | Ready to discharge |

The inverter controller 114 comprises support circuits 254 and a memory 256, each coupled to a central processing unit (CPU) 252. The CPU 252 may comprise one or more processors, microprocessors, microcontrollers and combinations thereof configured to execute non-transient software instructions to perform various tasks in accordance with embodiments of the present invention. The CPU 252 may additionally or alternatively include one or more application specific integrated circuits (ASICs). In some embodiments, the CPU 252 may be a microcontroller comprising internal memory for storing controller firmware that, when executed, provides the controller functionality herein. The inverter controller 114 may be implemented using a general purpose computer that, when executing particular software, becomes a specific purpose computer for performing various embodiments of the present invention.

The support circuits 254 are well known circuits used to promote functionality of the CPU 252. Such circuits include, but are not limited to, a cache, power supplies, clock circuits, buses, input/output (I/O) circuits, and the like. The inverter controller 114 may be implemented using a general purpose computer that, when executing particular software, becomes a specific purpose computer for performing various embodiments of the present invention. In one or more embodiments, the CPU 252 may be a microcontroller comprising internal memory for storing controller firmware that, when executed, provides the controller functionality described herein.

The memory 256 may comprise random access memory, read only memory, removable disk memory, flash memory, and various combinations of these types of memory. The memory 256 is sometimes referred to as main memory and may, in part, be used as cache memory or buffer memory. The memory 256 generally stores the operating system (OS) 258, if necessary, of the inverter controller 114 that can be supported by the CPU capabilities. In some embodiments, the OS 258 may be one of a number of commercially available operating systems such as, but not limited to, LINUX, Real-Time Operating System (RTOS), and the like.

The memory 256 stores non-transient processor-executable instructions and/or data that may be executed by and/or used by the CPU 252. These processor-executable instructions may comprise firmware, software, and the like, or some combination thereof. The memory 256 stores various forms of application software, such as a power conversion control module 270 for controlling the bidirectional power conversion, and a battery management control module 272.

The battery management control module 272 enables state of charge (SOC) estimation by the inverter 102. Upon startup, the SOC is unknown by the inverter 102 and must be determined (e.g., based on tracking current from an end of charge state to an end of discharge state). When the inverter 102 determines that the battery 120 refuses to take any current, the battery 120 is considered fully charged. The inverter 102 sets the required output current to be generated at zero, measures the battery voltage, and sets the estimated SOC to an upper bound, such as 100%. When the inverter 102 determines that no current is coming from the battery 120 during a discharge state, the battery 120 is considered fully discharged. The inverter measures the battery voltage, which may drop, for example, to 14V, and the inverter 102 sets the estimated SOC to a lower bound, such as 0%. Additionally, an internal coulomb counter 250 determines a coulomb count and couples the count to the controller 114 for use in tracking the current for estimating the SOC. Because a coulomb counter accumulates current measurement values over time, a small error or offset in the current measurement also accumulates, which may become significant over the integration time interval. As such, offset current accuracy is particularly important to the accuracy of the SoC estimator.

By establishing these upper and lower bounds of the estimated SOC and tracking the current flow between these events, the inverter 102 "learns" the total capacity as well as the present state within the cycle. The inverter 102 may use the estimated SOC for determining when to charge and discharge the battery 120. Generally, the inverter 102 does not drive the battery 120 below a threshold percentage of discharge, where the threshold may be, for example, between 5 and 20%.

In some embodiments, the battery management control module 272 also provides equivalent series resistance (ESR) estimation. By estimating the ESR of the battery, which is temperature dependent and charge level dependent, information on the battery state (e.g., battery health) can be determined. As a result of the natural disturbance on the voltage and current across the battery 120 during power conversion, a ripple voltage exists on the DC battery voltage in addition to a ripple on the DC current (e.g., for a 120 Hz grid, a 120 Hz current ripple would be present). By correlating the ripple voltage versus the ripple current (essentially dV/dI), the ESR of the battery 120 can be estimated.

In such embodiments, the inverter 102 performs a correlation between the ripple on the battery current (Ibat) and the battery voltage (Vbat) and estimates the ESR at twice the line frequency. The estimated ESR may be used to estimate the battery's state of health (SoH) and/or degradation. Additionally, the ESR may be used to estimate actual battery voltage, versus the observed battery voltage. When the battery voltage reaches the high or low end of operation, or the high or low end of SOC, the inverter 102 reduces the current when the estimated ESR increases (i.e., the current is tapered).

Further detail on the functionality provided by the BMU modules and the inverter modules is described below with respect to FIG. 3

Figure 3:
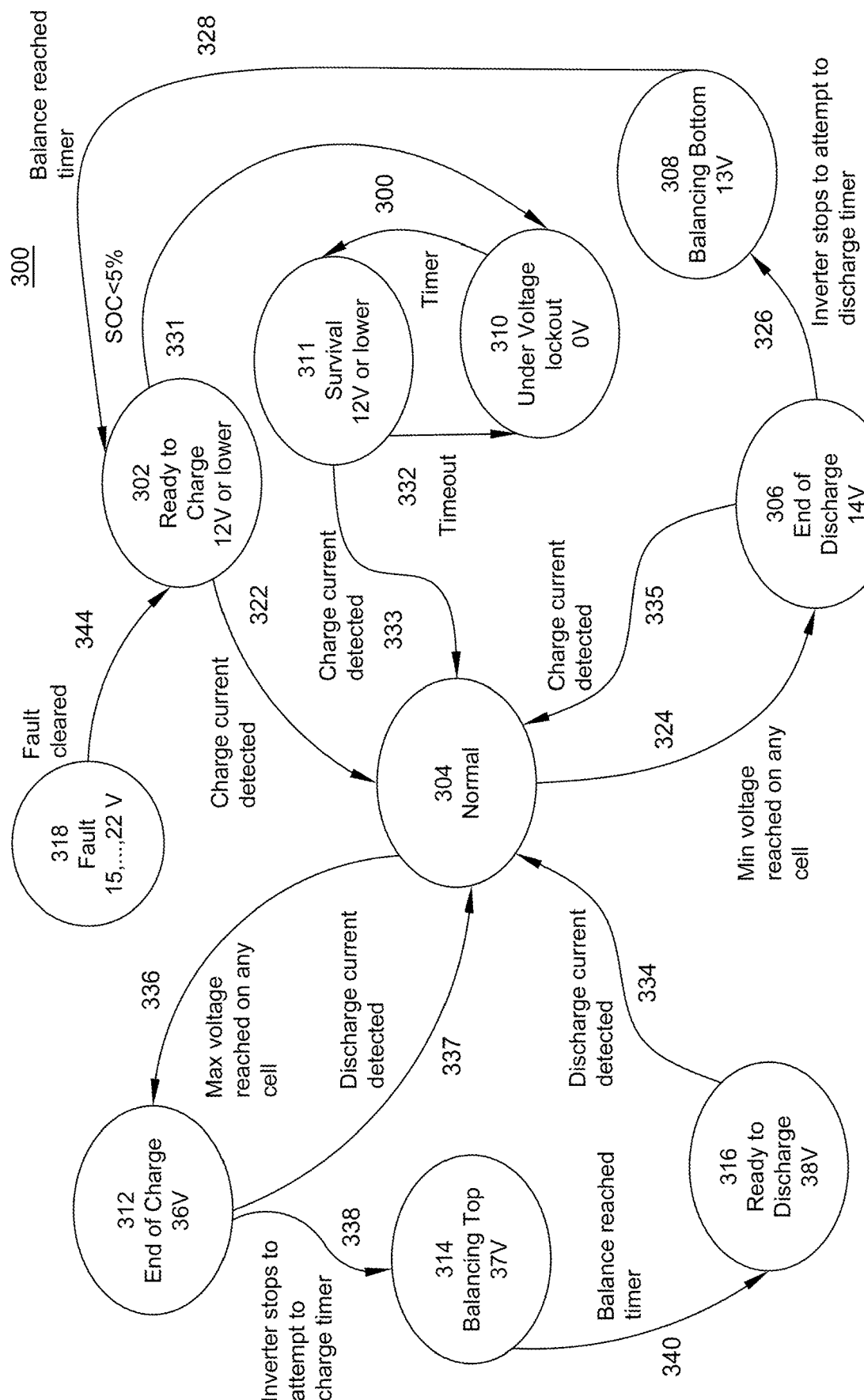
FIG. 3 is a state diagram illustrating states of the AC battery system shown in FIG. 2 in accordance with one or more embodiments of the present invention.

FIG. 3 is a state diagram 300 illustrating states of the AC battery system 200 shown in FIG. 2 in accordance with one or more embodiments of the present invention. In one embodiment, the state diagram 300 depicts the states associated with the charge process as implemented by the BMU 190 and the inverter controller 114.

The system 200 may start in a ready to charge state 302, where the battery voltage is at or less than a particular ready to charge state threshold, for example at or below 12 V. At ready to charge state switch 230 is active (i.e. on) to allow charging current. Since the system 200 may be in the ready to charge state 302 following a fault or an end of discharge (as described in more detail further below), the inverter 102 is unaware of where in the cycle the system is (i.e., whether to charge or discharge) as well as the battery SOC. In order to "unlock" the system, the inverter 102 attempts to charge the battery 120 by providing current to the battery 120. If a period of time passes and the SOC measured by the BMU 190 falls below a minimum threshold (e.g. 5%), the state transitions from the ready to charge state 302 to an under voltage lockout state 310 via transition 331. After a period of time (as determined, e.g., by a timer) in the under voltage lockout state 310, the state transitions via 330 to a low power survival state 311.

In the low power survival state 311, if the inverter 102 attempts to charge the battery 120, a transition via 333 to a normal state 304 can occur. After a timeout period (as determined, e.g., by a timer), the survivability state 311 transitions via 332 to the under voltage lockout state 310.

When, during the ready to charge state 302, charge current is detected, the state transitions via transition 322 from the ready to charge state 302 to a normal state 304. In the normal state, both switches 228 and 230 between the battery 120 and the inverter 102 are active (i.e., on) and the battery 120 can charge and discharge. When the battery 120 is discharged to the point where a minimum cell voltage occurs (i.e., when the minimum voltage is reached on any cell within the battery 120), the switch 228 is deactivated to disable current flow from the battery 120 to the inverter 102 and the state transitions from the normal state 304 to an end of discharge state 306 via transition 324. Generally, the inverter 102 never allows the battery 120 to discharge to the point that the inverter 102 cannot restart. The inverter may allow for the possibility that the battery is fully discharged when the inverter 102 turns back on and the SOC has degraded.

In the end of discharge state 306, the inverter 102 sets the required output current to be generated at zero in order to stop attempts to discharge the battery 120, measures the battery voltage, and sets its estimated SOC to a lower bound (e.g., 0%). Additionally, the BMU 190 sets its estimated SOC to a lower bound (e.g., 0%). The state transitions from the end of discharge state 306 to a balancing state 308 via transition 326.

During end of discharge state 306, if the inverter 102 attempts to charge the battery 120, the end of discharge state 306 may transition to the normal state 304 via 335 transition.

As a result of difference in cell capacities with the battery 120, balancing is performed in order to balance the voltage of the cell or cells that have reached minimum voltage to the same level as the remaining cells (i.e., the voltage across all battery cells is balanced to be the same as the lowest voltage cell). In some embodiments, such as the embodiment described herein, balancing the voltage across all of the battery cells is done following both end of discharge and end of charge, although in some alternative embodiments voltage balancing of the battery cells may be done only following end of discharge or only following end of charge.

Once the voltage is balanced across the battery cells, the state transitions from the balancing state 308 back to the ready to charge state 302 via transition 328.

When, during the normal state 304, the battery 120 is charged to the point where a maximum cell voltage occurs (i.e., when the maximum voltage is reached on any cell within the battery 120), the switch 230 is deactivated to disable the battery charging capability and the state transitions from the normal state 304 to an end of charge state 306 via transition 336. In the end of charge state 312, the inverter 102 sets the required output current to be generated at zero in order to stop attempting to charge the battery 120, measures the voltage, and sets its estimated SOC to an upper bound (e.g., 100%). Additionally, the BMU 190 sets its estimated SOC to an upper bound (e.g., 100%). By resetting the upper and lower bounds of the estimated SOCs at both the BMU 190 and the inverter 102 at each end of charge and end of discharge state, the BMU's estimated SOC and the inverter's estimated SOC remain synchronized with one another.

During the end of charge state 312, if the inverter 102 attempts to discharge the battery 120, the end of charge state 312 may transition to the normal state 304 via 337 transition.

The state transitions from the end of charge state 312 to a balancing state 314 when the inverter stops attempting to charge the battery 120 (i.e., at transition 338). Once the battery cells are balanced, the state transitions from the balancing state 314 to a ready to discharge state 316 via transition 340. The BMU 190 activates the switch 228 to enable battery discharge and the state transitions from the fully charged state 316 to the normal state 304 via transition 334.

The system 200 may enter a fault state 318 from any of the previously described states. The state then transitions from the fault state 318 to the ready to charge state 302 when a fault cleared event 344 occurs.

While the foregoing is directed to embodiments of the present invention, other and further embodiments of the invention may be devised without departing from the basic scope thereof, and the scope thereof is determined by the claims that follow.

The invention claimed is:

1. A method for AC battery operation, comprising:
   determining, at a battery management unit (BMU), which is coupled to an AC battery system comprising a power converter and a battery that is rechargeable, if the battery is charged to a first predetermined capacity;
   measuring a battery voltage;
   setting an estimated state of charge (SOC) to an upper bound based on a measured battery voltage;
   determining, at the battery management unit (BMU), if the battery is discharged to a second predetermined capacity;
   remeasuring the battery voltage;
   setting the estimated state of charge (SOC) to a lower bound based on a remeasured battery voltage;
   enabling a state of a charge (SOC) estimation of the battery based on a set upper bound and a set lower bound; and
   transitioning from a ready to charge state to an under voltage lockout state when a first period of time passes and the state of charge (SOC) measured by the battery management unit (BMU) falls below a minimum threshold and after a second period of time passes in the under voltage lockout state, transitioning to a low power survival state.

2. The method of claim 1, wherein the first predetermined capacity is when the battery is at an end of charge state and is fully charged.

3. The method of claim 1, wherein the second predetermined capacity is when the battery is at an end of discharge state and is fully discharged.

4. The method of claim 1, wherein the upper bound is 100%.

5. The method of claim 1, wherein the lower bound is 0%.

6. The method of claim 1, wherein remeasuring the battery voltage comprises measuring a voltage drop to 14V.

7. The method of claim 1, further comprising determining a coulomb count between measuring the battery voltage and remeasuring the battery voltage.

8. The method of claim 7, further comprising learning at the power converter a total capacity and a present state within at least one of a charge state of the battery or a discharge state of the battery, based on the set upper bound and the set lower bound of the estimated SOC and tracking of current flow between the battery and the power converter from an end of charge state to an end of discharge state.

9. The method of claim 1, further comprising, prior to measuring the battery voltage, setting a required output current to be generated at the battery to a first predetermined value.

10. The method of claim 9, wherein the first predetermined value is 0.

11. The method of claim 1, further comprising:
    determining, at each of the battery management unit (BMU) and the power converter, a bias control voltage and SOC values; and
    periodically synchronizing estimated SOC values with one another.

12. The method of claim 11, wherein coupling the bias control voltage to the power converter comprises regulating, by a bias control module and when the battery management unit (BMU) does not allow charging or discharging of the battery, battery output voltage to a predefined value.

13. The method of claim 11, wherein the bias control voltage indicates a fault condition.

14. The method of claim 11, wherein the bias control voltage indicates a ready to charge state for starting the power converter.

15. The method of claim 1, further comprising balancing, by the BMU, voltage across all cells of the battery following at least one of one or more cells of the battery reaching a minimum voltage or one or more cells of the battery reaching a maximum voltage.

16. The method of claim 1, further comprising:
determining, by the BMU, when an estimated SOC is below a threshold; and
disconnecting, when the estimated SOC is below the threshold, the battery from the power converter.

17. The method of claim 16, further comprising periodically attempting, by the BMU, to reconnect the power converter to the battery.

18. The method of claim 17, wherein time between attempted reconnections is determined by a semi-random increasing timer.

19. The method of claim 1, wherein the power converter is a bidirectional inverter.

20. An AC battery system, comprising:
a battery that is rechargeable;
a battery management unit (BMU) coupled to the battery;
a power converter coupled to the battery and the BMU; and
a controller configured to:
determine, at the BMU, if the battery is charged to a first predetermined capacity;
measure a battery voltage;
set an estimated state of charge (SOC) to an upper bound based on a measured battery voltage;
determine, at the battery management unit (BMU), if the battery is discharged to a second predetermined capacity;
remeasure the battery voltage;
set the estimated state of charge (SOC) to a lower bound based on a remeasured battery voltage;
enable a state of a charge (SOC) estimation of the battery based on the set upper bound and the set lower bound; and
transitioning from a ready to charge state to an under voltage lockout state when a first period of time passes and the state of charge (SOC) measured by the battery management unit (BMU) falls below a minimum threshold and after a second period of time passes in the under voltage lockout state, transitioning to a low power survival state.

* * * * *